United States Patent
Myers

(10) Patent No.: US 11,940,844 B2
(45) Date of Patent: *Mar. 26, 2024

(54) ELECTRONIC DEVICE WITH WRAP AROUND DISPLAY

(71) Applicant: Apple Inc., Cupertino, CA (US)

(72) Inventor: Scott A. Myers, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/971,357

(22) Filed: Oct. 21, 2022

(65) Prior Publication Data

US 2023/0044402 A1 Feb. 9, 2023

Related U.S. Application Data

(63) Continuation of application No. 17/481,812, filed on Sep. 22, 2021, now Pat. No. 11,487,330, which is a
(Continued)

(51) Int. Cl.
| | |
|---|---|
| *G06F 1/16* | (2006.01) |
| *G06F 3/01* | (2006.01) |
| *G06F 3/041* | (2006.01) |
| *G06F 3/04817* | (2022.01) |
| *G06F 3/0487* | (2013.01) |
| *G06F 3/14* | (2006.01) |

(Continued)

(52) U.S. Cl.
CPC .......... *G06F 1/1652* (2013.01); *G06F 1/1613* (2013.01); *G06F 1/1626* (2013.01); *G06F 1/1633* (2013.01); *G06F 3/013* (2013.01); *G06F 3/0412* (2013.01); *G06F 3/04817* (2013.01); *G06F 3/0487* (2013.01); *G06F 3/1423* (2013.01); *H04M 1/0268* (2013.01); *H04M 1/0269* (2022.02); *H05K 7/06* (2013.01); *H05K 13/00* (2013.01); *Y10T 29/49002* (2015.01); *Y10T 29/5313* (2015.01)

(58) Field of Classification Search
None
See application file for complete search history.

(56) References Cited

U.S. PATENT DOCUMENTS

| | | |
|---|---|---|
| 6,215,480 B1 | 4/2001 | Danis et al. |
| 6,311,076 B1 | 10/2001 | Peuhu et al. |
| | (Continued) | |

FOREIGN PATENT DOCUMENTS

| | | |
|---|---|---|
| CN | 1798351 A | 7/2006 |
| CN | 101432792 A | 5/2009 |
| | (Continued) | |

OTHER PUBLICATIONS

Korean Patent Application No. 10-2016-7036014—Notice of Amendment Dismissal and the Second Notice of Final Rejection dated Dec. 20, 2017.

(Continued)

*Primary Examiner* — Nicholas J Lee
(74) *Attorney, Agent, or Firm* — Kendall P. Woodruff

(57) ABSTRACT

A consumer electronic product includes at least a transparent housing and a flexible display assembly enclosed within the transparent housing. In the described embodiment, the flexible display assembly is configured to present visual content at any portion of the transparent housing.

20 Claims, 8 Drawing Sheets

Related U.S. Application Data continuation of application No. 16/503,168, filed on Jul. 3, 2019, now Pat. No. 11,137,799, which is a continuation of application No. 15/954,564, filed on Apr. 16, 2018, now Pat. No. 10,345,860, which is a continuation of application No. 15/151,360, filed on May 10, 2016, now Pat. No. 9,983,630, which is a continuation of application No. 14/680,905, filed on Apr. 7, 2015, now Pat. No. 9,367,095, which is a continuation of application No. 14/523,480, filed on Oct. 24, 2014, now Pat. No. 9,146,590, which is a continuation of application No. 14/160,477, filed on Jan. 21, 2014, now Pat. No. 8,896,563, which is a continuation of application No. 13/245,646, filed on Sep. 26, 2011, now Pat. No. 8,665,236.

(51) Int. Cl.
  H04M 1/02 (2006.01)
  H05K 7/06 (2006.01)
  H05K 13/00 (2006.01)

(56) References Cited

U.S. PATENT DOCUMENTS

| | | |
|---|---|---|
| 6,655,788 B1 | 12/2003 | Freeman |
| 6,721,023 B1 | 4/2004 | Weiss et al. |
| 7,724,508 B2 | 5/2010 | Bemelmans et al. |
| 7,953,462 B2 | 5/2011 | Harry |
| 8,085,994 B2 | 12/2011 | Kim |
| 8,096,068 B2 | 1/2012 | Van Rens |
| 8,860,632 B2 | 10/2014 | Kilpatrick, II et al. |
| 2003/0060269 A1 | 3/2003 | Paulsen et al. |
| 2005/0083465 A1 | 4/2005 | Niiyama et al. |
| 2005/0174302 A1 | 8/2005 | Ishii |
| 2006/0133047 A1 | 6/2006 | Tomizuka et al. |
| 2007/0115683 A1 | 5/2007 | Park |
| 2007/0190274 A1 | 8/2007 | Hamagushi et al. |
| 2007/0247422 A1 | 10/2007 | Vertegaal et al. |
| 2008/0146285 A1 | 6/2008 | Lee et al. |
| 2008/0204367 A1 | 8/2008 | Lafaree et al. |
| 2008/0212271 A1 | 9/2008 | Misawa |
| 2008/0223708 A1 | 9/2008 | Joo |
| 2008/0303782 A1 | 12/2008 | Grant et al. |
| 2009/0009480 A1 | 1/2009 | Heringslack |
| 2009/0019401 A1 | 1/2009 | Park et al. |
| 2009/0270142 A1 | 10/2009 | Liang |
| 2010/0117975 A1* | 5/2010 | Cho .................. G06F 3/04883 345/173 |
| 2010/0127965 A1 | 5/2010 | Park |
| 2010/0164973 A1* | 7/2010 | Huitema .............. G06F 1/1615 361/437 |
| 2010/0182518 A1 | 7/2010 | Kimse et al. |
| 2011/0001710 A1 | 1/2011 | Wang |
| 2011/0037866 A1* | 2/2011 | Iwamoto ................ G06F 3/012 348/222.1 |
| 2011/0043479 A1 | 2/2011 | van Aerle et al. |
| 2011/0095999 A1 | 4/2011 | Hayton |
| 2011/0141114 A1 | 6/2011 | Chen et al. |
| 2011/0148797 A1 | 6/2011 | Huitema et al. |
| 2011/0187655 A1 | 8/2011 | Min et al. |
| 2011/0188180 A1 | 8/2011 | Pakula et al. |
| 2011/0261002 A1 | 10/2011 | Verthein |
| 2012/0038546 A1 | 2/2012 | Cormer et al. |
| 2013/0033434 A1 | 2/2013 | Richardson et al. |
| 2013/0107433 A1* | 5/2013 | Mycroft ............... H05K 5/0017 361/679.01 |

FOREIGN PATENT DOCUMENTS

| | | |
|---|---|---|
| EP | 1093008 A1 | 4/2001 |
| EP | 2192750 A2 | 6/2010 |
| EP | 2354904 A2 | 8/2011 |
| EP | 2289063 B1 | 12/2011 |
| JP | 2000332866 A | 11/2000 |
| JP | 2002082646 A | 3/2002 |
| JP | 2003186462 A | 7/2003 |
| JP | 2003345286 A | 12/2003 |
| JP | 2005004210 A | 1/2005 |
| JP | 2005250442 A | 9/2005 |
| JP | 2006005712 A | 1/2006 |
| JP | 2006058753 A | 3/2006 |
| JP | 2006171514 A | 6/2006 |
| JP | 2006215116 A | 8/2006 |
| JP | 2007072375 A | 3/2007 |
| JP | 2007150866 A | 6/2007 |
| JP | 2008139163 A | 6/2008 |
| JP | 2008152184 A | 7/2008 |
| JP | 2008530611 A | 8/2008 |
| JP | 2010035107 A | 2/2010 |
| JP | 2011034029 A | 2/2011 |
| JP | 2011123501 A | 6/2011 |
| KR | 1609943 A | 4/2005 |
| KR | 1020060081380 A | 7/2006 |
| KR | 20060103929 A | 10/2006 |
| KR | 1020090005680 A | 1/2009 |
| KR | 20100019164 A | 2/2010 |
| KR | 20100052227 A | 5/2010 |
| KR | 20100081161 | 7/2010 |
| KR | 20100137646 A | 12/2010 |
| KR | 1020110052743 A | 5/2011 |
| KR | 20110068169 A | 6/2011 |
| KR | 20110082941 A | 7/2011 |
| KR | 1020110094112 A | 8/2011 |
| WO | 2009131447 A1 | 10/2009 |
| WO | 2011005318 A2 | 1/2011 |
| WO | 2011084699 A1 | 7/2011 |
| WO | 2011104837 A1 | 9/2011 |
| WO | 2011114190 A1 | 9/2011 |

OTHER PUBLICATIONS

Japanese Patent Application No. 2016-152707—Office Action dated Jul. 18, 2017.
Korean Patent Application No. 10-2016-7036014—Office Action dated Aug. 31, 2017.
Chinese Patent Application No. 201280046350.0—Third Office Action dated Sep. 20, 2017.
Korean Patent Application No. 10-2014-7006421—Final Office Action dated Sep. 28, 2016.
Chinese Patent Application No. 201280046350.0—Office Action dated Jun. 28, 2016.
Korean Patent Application No. 10-2014-7006421—Office Action dated Mar. 21, 2017.
Chinese Patent Application No. 201280046350.0—Office Action dated Mar. 17, 2017.
PCT/US2012/056311—International Search Report dated Mar. 28, 2013.
Japanese Patent Application No. 2014-533615—Office Action dated Feb. 23, 2015.
Korean Patent Application No. 10-2014-7006421—Office Action dated Jul. 31, 2015.
Japanese Patent Application No. 2014-533615—Office Action dated Oct. 13, 2015.
European Patent Application No. 12834888.5—Supplementary European Search Report dated Oct. 29, 2015.
Korean Patent Application No. 10-2016-7036014—Office Action dated Mar. 21, 2017.

* cited by examiner

ELECTRONIC DEVICE WITH WRAP AROUND DISPLAY

CROSS REFERENCE TO RELATED APPLICATIONS

This application is a continuation of U.S. patent application Ser. No. 17/481,812, filed Sep. 22, 2021, which is a continuation of U.S. patent application Ser. No. 16/503,168, filed Jul. 3, 2019, now U.S. Pat. No. 11,137,799, which is a continuation of U.S. patent application Ser. No. 15/954,564, filed Apr. 16, 2018, now U.S. Pat. No. 10,345,860, which is a continuation of U.S. patent application Ser. No. 15/151,360, filed May 10, 2016, now U.S. Pat. No. 9,983,630, which is a continuation of U.S. patent application Ser. No. 14/680,905, filed Apr. 7, 2015, now U.S. Pat. No. 9,367,095, which is a continuation of U.S. patent application Ser. No. 14/523,480, filed Oct. 24, 2014, now U.S. Pat. No. 9,146,590, which is a continuation of U.S. patent application Ser. No. 14/160,477, filed Jan. 21, 2014, now U.S. Pat. No. 8,896,563, which is a continuation of U.S. patent application Ser. No. 13/245,646, filed Sep. 26, 2011, now U.S. Pat. No. 8,665,236, all of which are hereby incorporated by reference herein in their entireties for all purposes.

FIELD

The described embodiments relate generally to portable electronic devices. In particular, expanding the functionality of portable electronics devices by providing a more efficient mechanism for presenting visual content is disclosed.

BACKGROUND

In the last few years the functionality of portable electronic devices has increased exponentially. Further improvements be realized by investigating ways to maximize the utility of unused portions of these devices. Form factor is an interesting area for development given that a large majority of portable electronic devices have settled into a standard form factor; namely a flat planar form factor with a display on one side and an opaque housing which contains the electrical components covering the rear surface of the device. Unfortunately, this popular form factor, leaves the sides and rear surfaces of the device unused or at best configured with buttons and switches with fixed location and functionality. Since many of these buttons and switches have fixed functionality they cannot always be incorporated into third party applications.

Therefore, there exists a need for an improved form factor for portable electronic devices which allows functionality to extend to more than one surface of the device.

SUMMARY

This paper describes various embodiments that relate to an apparatus, method, and computer readable medium for creating a portable electronic device with a wraparound display.

In one embodiment, a consumer electronic product is described. The consumer electronic product includes at least a transparent housing and a flexible display assembly enclosed within the transparent housing. In the described embodiment, the flexible display assembly is configured to present visual content at any portion of the transparent housing.

In one aspect of the described embodiment, the consumer electronic product includes a second flexible display assembly. The second display acts to present visual content in cooperation with the flexible display assembly.

In another embodiment, a method for assembly of a multi-display portable electronic device is described. The method is carried out by performing at least the following operations: receiving a transparent enclosure, shaping a flexible display to conform to a cross section of the transparent enclosure, inserting the shaped flexible display into the transparent enclosure. Subsequent to the inserting, the shaped flexible display returns to an original shape that causes a display portion of the flexible display to press against an interior surface of the transparent enclosure. The method also includes the operation of enclosing the inserted flexible display into the enclosure.

An apparatus for assembly of a multi-display portable electronic device is described. In one embodiment, the apparatus includes at least means for receiving a transparent enclosure, means for shaping a flexible display to conform to a cross section of the transparent enclosure, and means for inserting the shaped flexible display into the transparent enclosure. Subsequent to the inserting, the shaped flexible display returns to an original shape that causes a display portion of the flexible display to press against an interior surface of the transparent enclosure. The apparatus also includes at least means for enclosing the inserted flexible display into the enclosure.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

The presently described embodiments relate generally to media devices. More particularly, a media device having a wrap-around display enclosed within a transparent enclosure is described.

In the following description, numerous specific details are set forth to provide a thorough understanding of the presently described embodiments. It will be apparent, however, to one skilled in the art that the presently described embodiments may be practiced without some or all of these specific details. In other instances, well known process steps have not been described in detail in order to avoid unnecessarily obscuring the presently described embodiments.

The majority of portable electronic device manufacturers utilize a common form factor consisting generally of a flat planar form factor with a single surface dedicated mainly for use as a display surface, while the other surfaces remain largely unused, save for the occasional button or switch. The conventional form factor has been used in devices such as smart phones, tablet devices, and electronic book readers. Although this form factor lends itself to electronic devices that are aesthetically pleasing and easy to handle, the requirement for a planar display and associated circuitry inherently limits the amount of surface area to single surface. More specifically, the size of the user interface is generally limited to a portion of the device that takes up less than half of the overall device surface area.

In one embodiment, utilizing a flexible display can provide additional viewing area without increasing either the size or shape of the electronic device. For example, a flexible display can be folded in such a way as to form a continuous loop such that images (still or video) can be presented in a wrap-around manner in which the images appear to be presented in a continuous loop. The flexible display can be folded into a tightly wound configuration and placed within an enclosure at least a portion of which is transparent. In some cases, the enclosure can be formed of glass at least a portion of which is made opaque (at least translucent) by the addition of ink or other masking material. In other cases, however, the entire enclosure can be fully transparent in which case the folded flexible display can unwind when placed within the glass enclosure. Once fully unwound, the flexible display can present images at any portion of the glass enclosure.

These and other embodiments are discussed below with reference to FIGS. 1-x. However, those skilled in the art will readily appreciate that the detailed description given herein with respect to these figures is for explanatory purposes only and should not be construed as limiting.

Figure 1A:
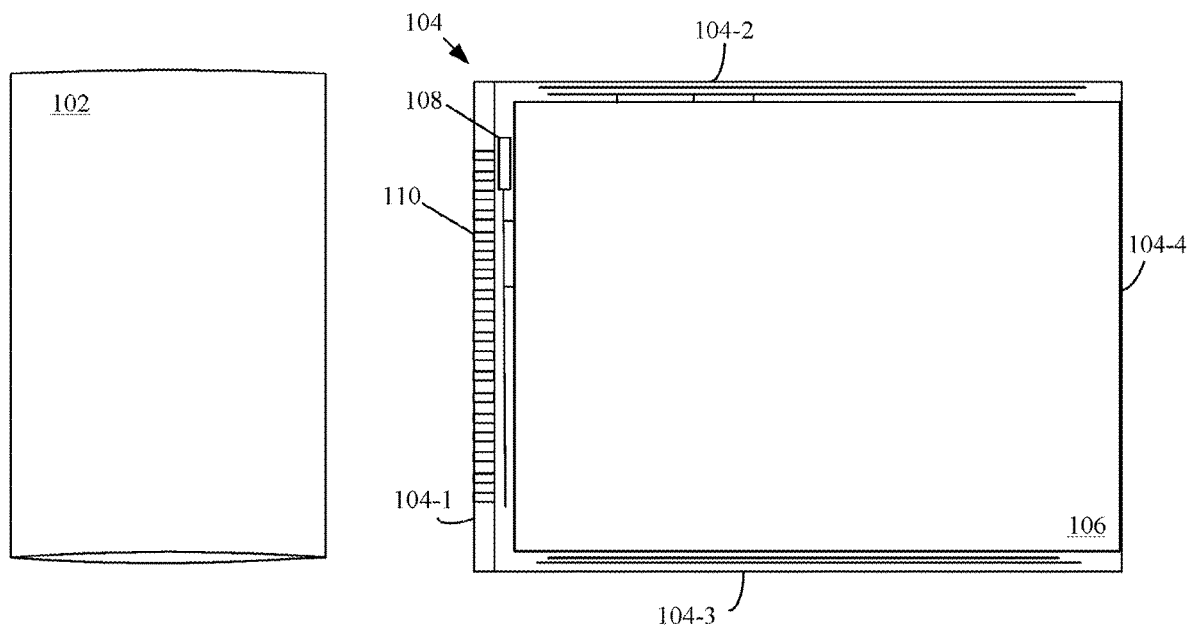
FIG. 1A shows a representative housing and associated flexible display assembly in an unassembled state.

FIG. 1A shows housing 102 alongside representative flexible display assembly 104. Housing 102 can take many forms. For example, housing 102 can be multi-part in which a portion is metallic in nature (such as aluminum) whereas another portion can be formed of optically transparent material such as glass. For the remainder of this discussion, however, housing 102 is considered to be fully formed of transparent (or at least semi-transparent) material such as glass. In this way and without loss of generality, transparent housing 102 may be made of any transparent material such as for example glass, or plastic. The material selected generally depends on many factors including, but not limited to, strength (tensile), density (lightweight), strength to weight ratio, Young's modulus, corrosion resistance, formability, finishing, recyclability, tooling costs, design flexibility, manufacturing costs, manufacturing throughput, reproducibility, and the like. The material selected may also depend on electrical conductivity, thermal conductivity, radio wave and optical transparency, combustibility, toxicity, and the like. The material selected may also depend on aesthetics, including color, surface finish, and weight.

In one particular embodiment, housing 102 can be formed from a glass tube. The glass tube may be formed from an extrusion or extrusion-like process. Some of the reasons for using glass over other materials are that glass is strong, stiff, and radio transparent and therefore a suitable material for an enclosure of an electronic device capable of wireless communications and presenting visual content at any surface thereof. The radio transparency is especially important for wireless hand held devices that include antennas internal to the enclosure. Radio transparency allows the wireless signals to pass through the enclosure and, in some cases, even enhances these transmissions. It will be understood that, although a glass enclosure is capable of wireless communications, the embodiments described herein need not be capable of wireless communication.

Using glass for the fabrication of housing 102 can also provide the portable electronic device with a unique, aesthetically pleasing appearance. To further provide an aesthetically pleasing appearance, the glass can also be coated with an oleophobic coating to reduce finger prints and smudging on the glass. The glass can also be coated with an anti-reflective coating to reduce glare. It will be understood that chemically strengthened glass can also be scratch resistant. The glass can also be color tinted in a wide variety of colors and can also have a variety of surface finishes including smooth and rough. For example, the glass can be polished to create a smooth (gloss) finish, or a blasting operation can performed to create a rough or textured (matte) finish. Portions of the glass can also be textured so that the textured surface will disperse light and can be used as light indicator. As discussed in more detail below, the glass material can be formed so that the enclosure can have a seamless or substantially seamless appearance. The seamless enclosure, in addition to being aesthetically pleasing, can provide the added benefit of less contamination and moisture intrusion into the interior of the device.

In some cases, even though housing 102 is fully fabricated from a transparent material such as glass, it may be desirable to obscure at least portions of housing 102 from the view of an end-user. For example, internal components may be visible through housing 102 detracting from the overall look and feel of the electronic product. Therefore, in some cases, portions of housing 102 can be optically obscured. The glass enclosure around the display can be made opaque so the operational components of the device are not visible. One method of rendering portions of housing 102 opaque is to use an ink printing process in those areas where opacity is desired to create a mask. For example, appropriately placed ink can render a masked region that is optically opaque. For example, an area surrounding a display can be masked to provide an emphasis and accentuate visual content presented by the display. It should be noted that in alternative embodiments, portions of housing 102 can be painted or screen printed. Other techniques for achieving opacity in certain areas, such as using a two-layer clad glass.

It should be noted that glass has been used in a wide variety of products, including electronic devices, such as watches, and phones. In these cases, however, the glass materials have not been used as structural components. In most of these cases, the glass materials have been used as cosmetic accoutrements or solely as a screen for a display. It is believed that, up until now, glass materials have never been used as a structural element providing substantially all of the structural frames, walls and main body of a consumer electronic device, and more particularly an enclosure of a portable electronic device, such as a media player or mobile phone.

The glass enclosure also allows a display screen to be positioned underneath and protected by the glass enclosure.

The glass material of the enclosure is capable of capacitive sensing so that a touch screen can be used through the glass enclosure. The cross-sectional shape, including both the outer and inner shapes of housing 102 may be widely varied. They may be formed from simple or intricate shapes, whether rectilinear and/or curvilinear. For hand held devices, it is typically preferred to use a shape that better fits the hand (e.g., form fits). By way of example, a rectangle with curved edges or an oval or pill shaped cross section having curvature that more easily receives the hand may be used. It should be noted that the inner cross-sectional shape may be the same or different from the external cross sectional shape of the main body. For example, it may be desirable to have a pill shaped external and a rectangular shaped interior, etc. In addition, although not a requirement, the front surface of the housing 102 may be substantially planar for placement of a display or a user interface that can be incorporated into housing 102 separate from the display.

In this particular embodiment, transparent housing 102 can take the form of an elliptical extrusion. The flexible display assembly 104 can be an active matrix light emitting diode (AMOLED) display manufactured on a polyimide substrate. In addition to being flexible, AMOLED displays allow pixels to be lit up individually, as opposed to conventional LCD technology in which the entire screen is in either an on or an off state. Consequently, an AMOLED screen can display small amounts of text at extremely conservative power levels. This type of display screen typically has an active display area 106 which has supporting circuitry that surrounds at least some of the edges. For example, flexible display assembly 104 has active display area 106 surrounded on three of four edges with supporting circuitry that generally includes display driver chip 108 and sensor flex connector 110 on side 104-1 and additional circuitry and associated connectors on sides 104-2 and 104-3. It should be noted that with suitable design considerations, remaining side 104-4 can be configured in such a way that only a small unused border sufficiently narrow to be effectively unnoticeable can be provided.

Figure 1B:
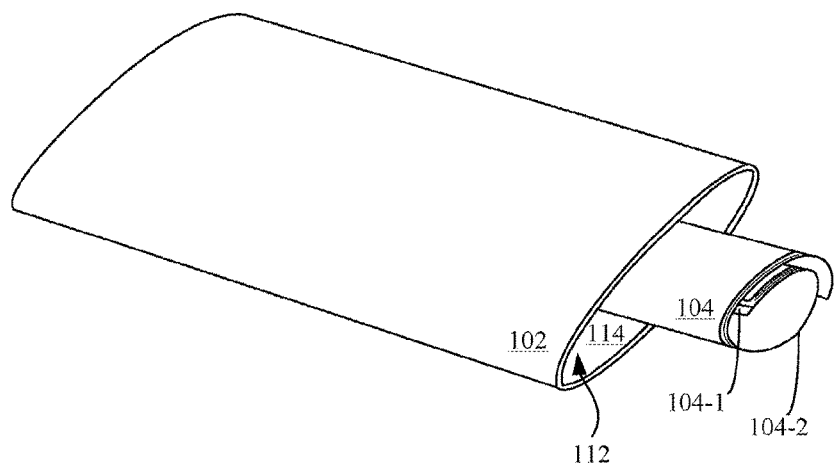
FIG. 1B shows a flexible display assembly in a rolled up configuration within housing of FIG. 1A in a partially assembled state.

One of the advantages of using a polyimide substrate is that the AMOLED display screen can be heated that allows the AMOLED display screen to be configured into any number of shapes. Moreover, once the heat is removed, the AMOLED display will then "remember" the original shape even if temporarily rolled up or flattened out. In this way, by heating AMOLED display assembly 104 while configured in a shape in accordance with transparent housing 102 AMOLED display assembly 104 easily conforms to the shape of transparent housing 102. For example, FIG. 1B shows a preheated AMOLED display assembly 104 temporarily rolled up as it is placed into lumen 112 of transparent housing 102. Once inside transparent housing 102, AMOLED display assembly 104 can be released resulting in AMOLED display assembly 104 "unwinding" to assume the shape of lumen 112 of transparent housing 102 in such a way that AMOLED display assembly 104 is arrayed against interior surface 114 of transparent housing 102. In order to secure unwound display assembly 104 to transparent housing 102, a laminating process can be performed subsequent to the unwinding of AMOLED display assembly 104 to interior surface 114 of transparent housing 102. For example, an adhesive can be placed between the interior surface 114 and AMOLED display assembly 104 at locations not viewable by an end-user. It should be noted that edges 104-2 and 104-3 of AMOLED display assembly 104 are now positioned at the top and bottom of transparent housing 102, leaving only edge 104-1 with the connector 110 and display driver chip 108 to be hidden from view. Once AMOLED display assembly 104 is securely attached to the inside surface of transparent housing 102, the other electrical components can be inserted.

Figure 2:
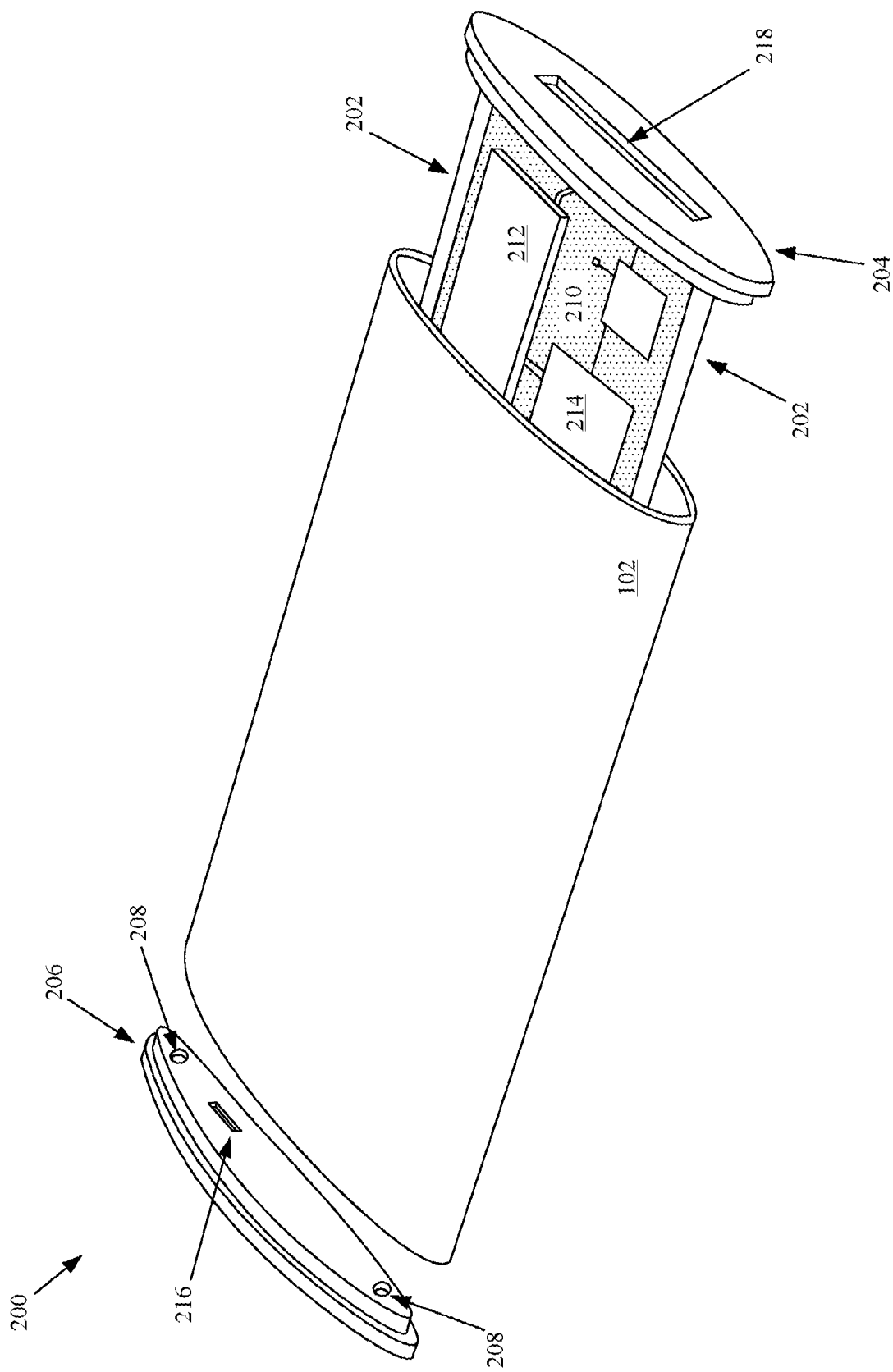
FIG. 2 shows a perspective view of portable electronic device as internal components of portable electronic device 200 are being inserted into transparent housing.

FIG. 2 shows a perspective view of portable electronic device 200 as internal components of portable electronic device 200 are being inserted into transparent housing 102. An internal frame for portable electronic device 200, which supports the electrical components, can include two support columns 202, which are secured by end cap 204 and end cap 206 by way of end cap receivers 208. End cap 204 and end cap 206 can be made of any suitable rigid material, such as plastic, aluminum, or even steel. Printed circuit board (PCB) 210 can be supported by a rigid framework (not shown) connecting support columns 202. PCB 210 allows the other supporting electrical components such as battery 212 and processor 214 to drive the operations of portable electronic device 200. End cap 204 and end cap 206 also include electrical connectors 216 so that components housed within them, such as data connector 218, and RF antennae (not shown) can cooperate and interact with electrical components disposed on PCB 210. Once end caps 204 and 206 are secured on either end of transparent housing 102 all the electrical components are enclosed within transparent housing 102. Support columns 202 can be mechanically fastened to end caps 204 and 206 so that the end caps stay firmly in place. In one embodiment, fasteners such as small screws (not shown) can be embedded in at least one of the end caps, allowing for the end cap to be released from support columns 202 when the screws are loosened. This configuration would allow the end caps to be easily removed for maintenance purposes. In another embodiment the removable end cap could also allow users to add end caps with additional functionality. For example, an end cap could be installed that would allow two devices to be connected together and act as one system. This could be as simple as having an end cap with a male data connector designed to attach to data connector 218 of another similar portable electronic device 200. In yet another embodiment an alternate end cap could have an improved camera or a different set of wireless antennae.

Figure 3:
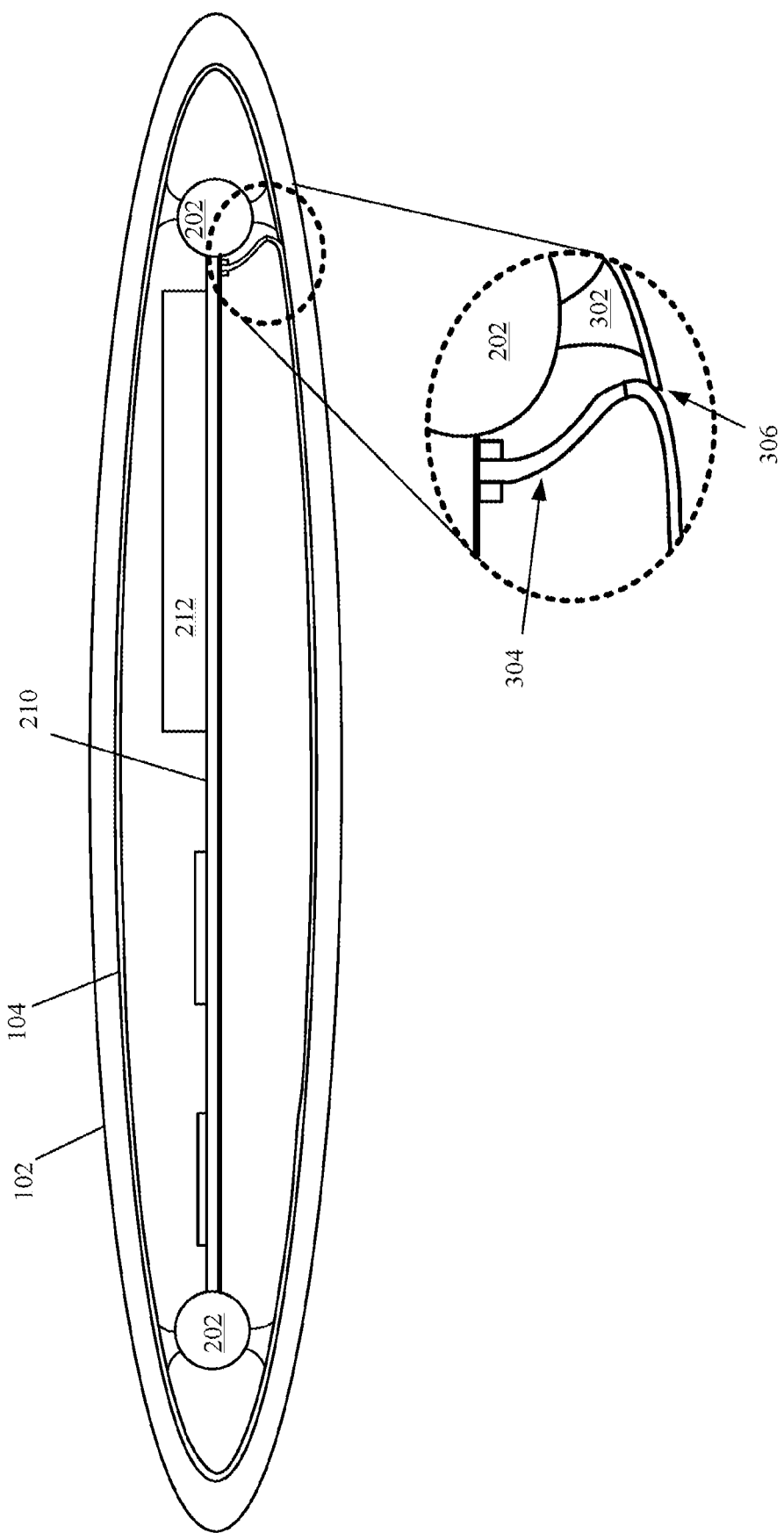
FIG. 3 shows a bottom view of portable electronic device in accordance with the described embodiments.

FIG. 3 shows a bottom view of portable electronic device 200 in accordance with the described embodiments. In this view structural support elements 302 are shown attached to support columns 202. Support elements 302 can help provide structural support to transparent housing 102. Structural support elements 302 can be deployed after the support columns and electrical components are all connected and in place, thereby providing further support for all the components housed within portable electronic device 200. In cases where transparent housing 102 is made of a material which requires reinforcement additional supports may be attached to the inner framework so that portable electronic device is truly robust. Also shown in this drawing is the connection between AMOLED display assembly 104 and PCB 210. The two components are attached by sensor flex 304, which allows data to pass between the two components. This diagram also shows how the two ends of AMOLED display assembly 104 join together at lap joint 306. The portion of AMOLED display assembly 104 that extends past the lap joint is the final portion of the border of AMOLED display assembly 104 that is hidden to provide one continuous display that extends around the entire device. If lap joint 306 cannot be made to look seamless it may be desirable to cover lap joint 306 with a thin line of dark paint on the interior of transparent housing 102. In this the lap joint can be positioned on one edge of the device to further conceal any apparent discontinuity. In situations where a dark paint concealer is used a butt joint could also be used as the cosmetic appearance of the device is less crucial. It should also be noted that although the lap joint is shown on a bottom portion of portable electronic device 200 it can be positioned anywhere along the inside of the device.

Figure 4:
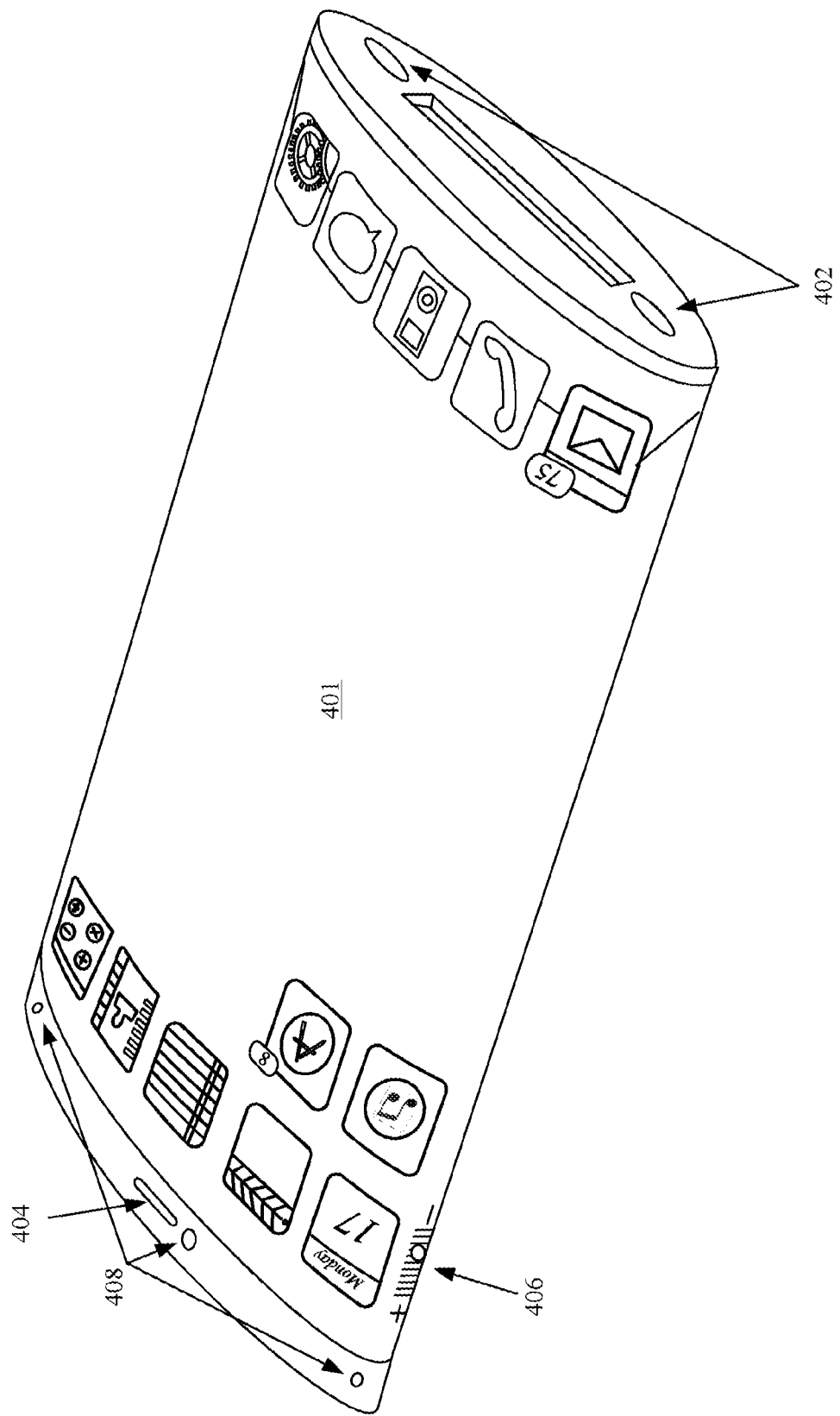
FIG. 4 shows a perspective view of portable electronic device in operation. Notice how the wrap around display substantially increases the available display area that can be used for display of icons, data, images, video and such.

FIG. 4 shows a perspective view of portable electronic device 200 in operation. Notice how the wrap around display substantially increases the available display area that can be used for display of icons, data, images, video and such. For example, as shown in FIG. 4, up to five application icons can be presented that span the width of display 401. Microphones 402 and speaker 404 allow portable electronic device 200 to act as a portable personal communication device, such as a smart phone. Furthermore, virtualization of the physical buttons allows for expanded functionality. For example, volume control 406 can be located at roughly the same position it would be if it were configured as a physical button; however, in this configuration the actual volume setting can be seen at any time (indicated by the circle between the + and − indicators). Additionally, by holding a finger over the volume indicator an action could be triggered expanding the volume control over the entire left side of the device. This would allow a user to make fine adjustments to the volume of portable electronic device 200. Once the adjustment control is released the control can return to its original size. A hold switch is another popular function that is often assigned to a physical button. Instead of the hold button a multi touch gesture along one of the sides could instead act as a method of locking and unlocking the hold function. Additional features that can be well suited for portable electronic device 200 include various image capture devices along the lines of cameras 408. It should be noted that since portable electronic device 200 can present visual content in any direction it is important for the portable electronic device 200 to be able to determine a current location of the end-user. In this way, any of cameras 408 can periodically capture an image and using basic facial recognition software, one or more of cameras 408 can be used to track the movement the end user's face in the space around it and as such be able to determine a general direction of the end-user and the field of vision of the end user and adjust the presentation of visual content by display 401 accordingly.

Figure 5A:
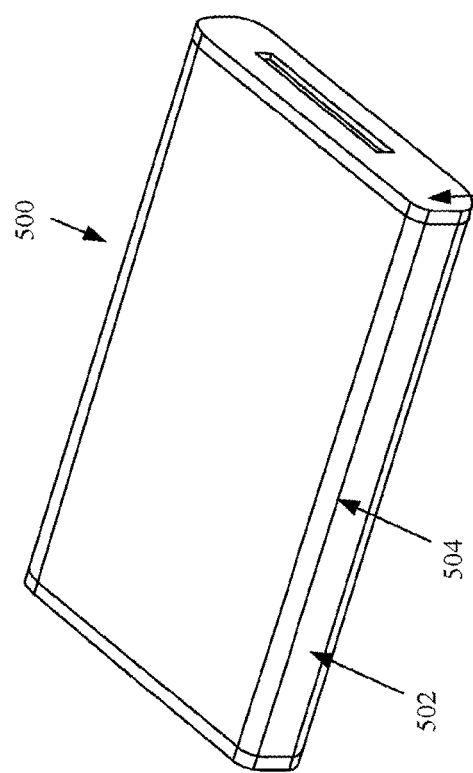
FIGS. 5A, 5B, and 5C illustrate a variety of additional representative form factors in which the described embodiments can be manufactured.
Figure 5B:
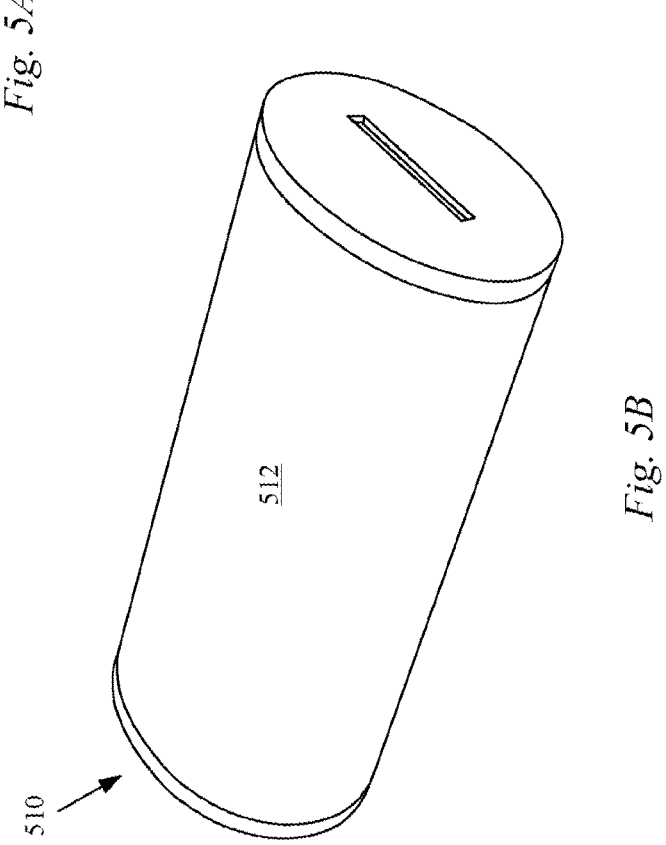
Figure 5C:
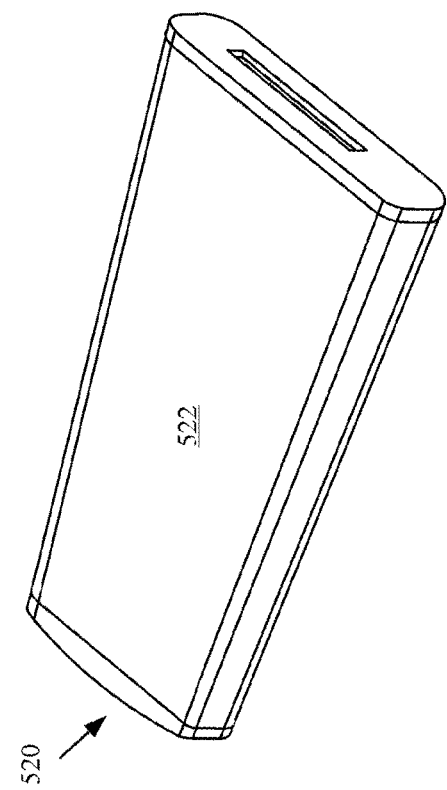

FIGS. 5A, 5B, and 5C illustrate a variety of additional representative form factors in which the described embodiments can be manufactured. For example, FIG. 5A shows embodiment 500 that includes rectangular shaped housing 502. It should be noted that the rounded corners of FIG. 5A permit an end-user's finger to move objects around the corners of the device. In yet another embodiment, transparent housing 502 can be strengthened by the addition of external frame 504. External frame 504 can provide support for corners 506 and provide additional support for portable electronic device 500. FIG. 5B shows embodiment 510 that includes a cylindrically shaped housing 512. In this case orientation sensors such as an accelerometer and facial tracking can be used in maintaining user interface correctly oriented in the visual field of the end user. In FIG. 5C showing embodiment 520 that includes housing 522 that can have a tapered shape with a variably sized cross section. In this embodiment, AMOLED display assembly 104 can be manufactured in a non-rectangular shape, allowing the display to conform to the internal surface of housing 520.

Figure 6:
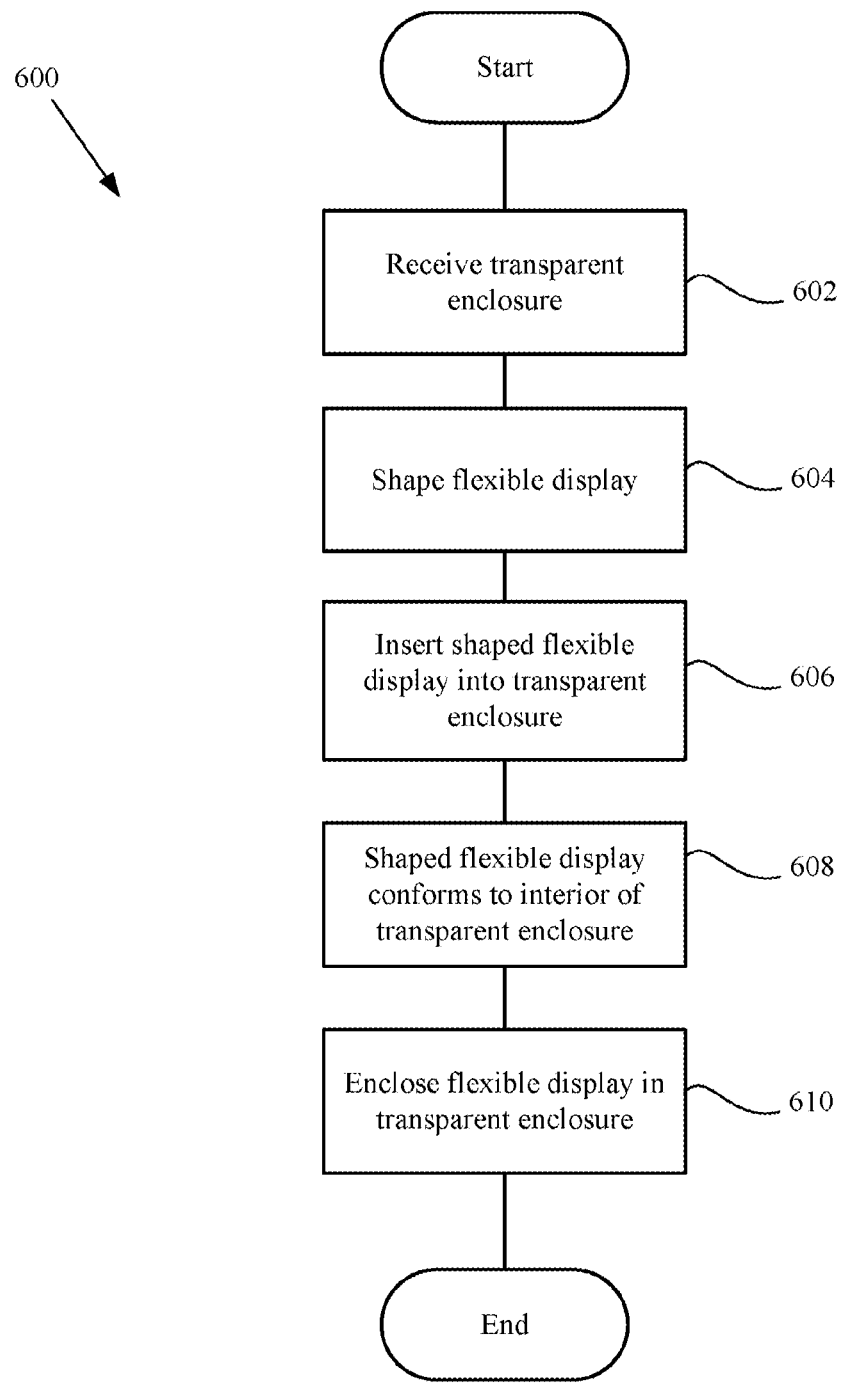
FIG. 6 shows a flowchart detailing process in accordance with the described embodiments.

FIG. 6 shows a flowchart detailing process 600 in accordance with the described embodiments. Process 600 can be used to assemble a portable communication device having a wrap-around flexible display enclosed within a transparent housing. The portable communication device can further include wireless communication functionality provide an end-user with the option of configuring the portable communication device as a personal communication device along the lines of a smart phone. In any case, process 600 begins at 602 by receiving an enclosure at least a portion of which is transparent. In one embodiment, the enclosure can be fully formed of a transparent material such as glass that can also be used as structural support for the portable communication device. In another embodiment, the enclosure can be a multi-part housing where one portion is formed of structural material such as metal such as aluminum whereas another portion can be formed of transparent material such as glass integrally formed with the metallic housing.

At 604, a flexible display is shaped in such a way as to be inserted into a lumen of the enclosure. For example, when the lumen of the enclosure is circular or circular-like in nature, the flexible display can be wound, or rolled, up into a shape consistent with the shape of the lumen. By rolling up the flexible display into, for example, a cylinder, the rolled up flexible display can be easily inserted into the lumen of the enclosure. Once the rolled up flexible display is within the lumen of the enclosure at 606, the flexible display unwinds, or unrolls, at 608 and conforms to the shape of the lumen and thereby provides a display surface at an interior surface. Next at 610, the enclosure is sealed at either or both ends. For example, end caps can be attached to the enclosure to complete the assembly of the portable communication device.

Figure 7A:
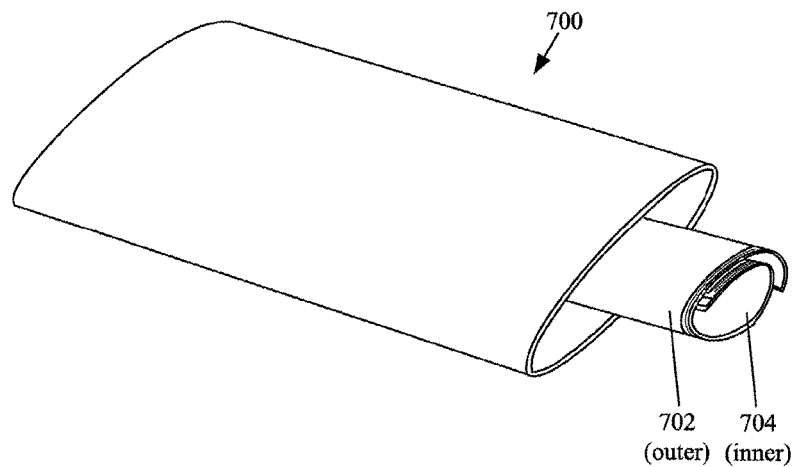
FIGS. 7A and 7B shows multiple display portable communication device in accordance with the described embodiments.
Figure 7B:
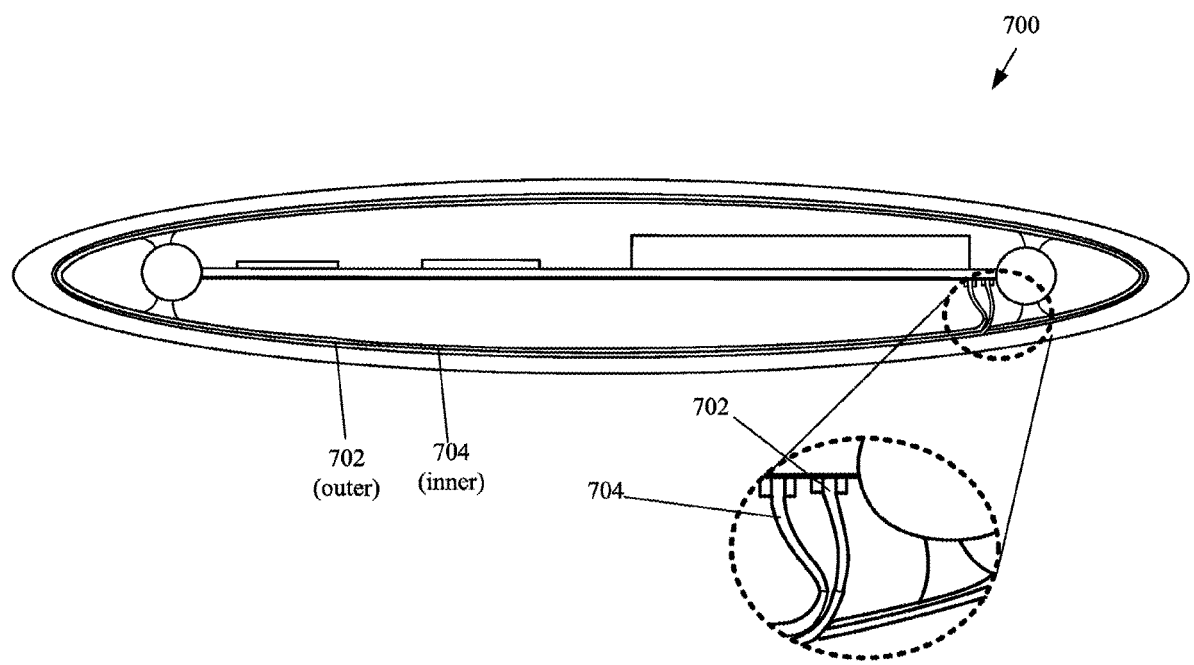

In one embodiment as shown in FIGS. 7A and 7B, a second flexible display can be inserted subsequent (or concurrent with) the insertion of the first flexible display. More particularly, FIGS. 7A and 7B shows multiple display portable electronic device 700 in accordance with the described embodiments. Multiple display portable electronic device 700 can include first flexible display 702 and second flexible display 704. In one embodiment, first flexible display 702 and second flexible display 704 can present visual content independent of each other. In alternative embodiments, first flexible display 702 and second flexible display 704 can cooperatively present visual content. For example, visual content can be presented by first flexible display 702 out of temporal phase with the visual content presented by second flexible display 704. In this way, an illusion of depth perception can be presented mimicking a 3D experience. In one embodiment, first flexible display 702 can be partially transparent such that visual content from second flexible display 704 can be viewed concurrent with visual content presented by first flexible display 702.

FIG. 7B shows a bottom view of multi-display portable electronic device 700 in accordance with the described embodiments.

Figure 8:
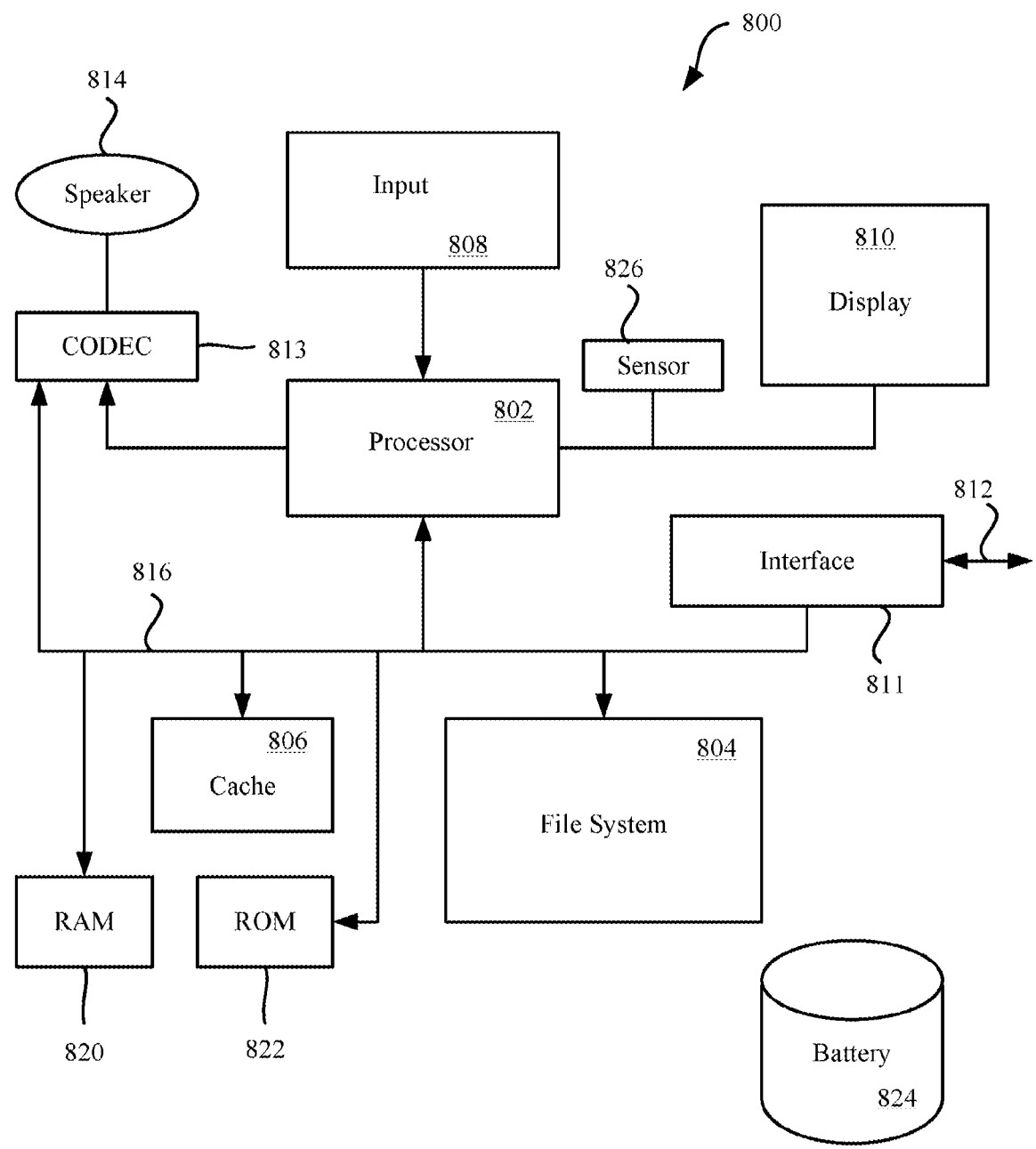
FIG. 8 is a block diagram of an electronic device suitable for use with the described embodiments.

FIG. 8 is a block diagram of an electronic device 800 suitable for use with the described embodiments. The electronic device 800 illustrates circuitry of a representative computing device. The electronic device 800 includes a processor 802 that pertains to a microprocessor or controller for controlling the overall operation of the electronic device 800. The electronic device 800 stores media data pertaining to media items in a file system 804 and a cache 806. The file system 804 is, typically, a storage disk or a plurality of disks. The file system 804 typically provides high capacity storage capability for the electronic device 800. However, since the access time to the file system 804 is relatively slow, the electronic device 800 can also include a cache 806. The cache 806 is, for example, Random-Access Memory (RAM)

provided by semiconductor memory. The relative access time to the cache 806 is substantially shorter than for the file system 804. However, the cache 806 does not have the large storage capacity of the file system 804. Further, the file system 804, when active, consumes more power than does the cache 806. The power consumption is often a concern when the electronic device 800 is a portable media device that is powered by a battery 824. The electronic device 800 can also include a RAM 820 and a Read-Only Memory (ROM) 822. The ROM 822 can store programs, utilities or processes to be executed in a non-volatile manner. The RAM 820 provides volatile data storage, such as for the cache 806.

The electronic device 800 also includes a user input device 808 that allows a user of the electronic device 800 to interact with the electronic device 800. For example, the user input device 808 can take a variety of forms, such as a button, keypad, dial, touch screen, audio input interface, visual/image capture input interface, input in the form of sensor data, etc. Still further, the electronic device 800 includes a display 810 (screen display) that can be controlled by the processor 802 to display information to the user. A data bus 816 can facilitate data transfer between at least the file system 804, the cache 806, the processor 802, and the CODEC 813.

In one embodiment, the electronic device 800 serves to store a plurality of media items (e.g., songs, podcasts, etc.) in the file system 804. When a user desires to have the electronic device play a particular media item, a list of available media items is displayed on the display 810. Then, using the user input device 808, a user can select one of the available media items. The processor 802, upon receiving a selection of a particular media item, supplies the media data (e.g., audio file) for the particular media item to a coder/decoder (CODEC) 813. The CODEC 813 then produces analog output signals for a speaker 814. The speaker 814 can be a speaker internal to the electronic device 800 or external to the electronic device 800. For example, headphones or earphones that connect to the electronic device 800 would be considered an external speaker.

The electronic device 800 also includes a network/bus interface 811 that couples to a data link 812. The data link 812 allows the electronic device 800 to couple to a host computer or to accessory devices. The data link 812 can be provided over a wired connection or a wireless connection. In the case of a wireless connection, the network/bus interface 811 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 826 can take the form of circuitry for detecting any number of stimuli. For example, sensor 826 can include a Hall Effect sensor responsive to external magnetic field, an audio sensor, a light sensor such as a photometer, and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data that can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device having front and rear surfaces, the electronic device comprising:
   a housing;
   a first display portion on the front surface and a second display portion on the rear surface;
   a camera on the front surface configured to capture an image; and
   control circuitry configured to process the captured image using facial recognition software and to adjust visual content on the second display portion based on the captured image.

2. The electronic device defined in claim 1 wherein the control circuitry is configured to track user movement based on the captured image.

3. The electronic device defined in claim 2 wherein the control circuitry is configured to adjust a location of the visual content on the second display portion based on the user movement.

4. The electronic device defined in claim 1 wherein the housing comprises a metal portion and a glass portion.

5. The electronic device defined in claim 4 wherein the metal portion extends between the front and rear surfaces and the glass portion overlaps the first display portion.

6. The electronic device defined in claim 4 wherein the first display portion comprises a capacitive touch sensor that detects touch input on the glass portion of the housing.

7. The electronic device defined in claim 4 wherein the glass portion of the housing has a planar portion on the front surface.

8. The electronic device defined in claim 1 wherein the first display portion comprises a flexible display with organic light-emitting diode pixels.

9. The electronic device defined in claim 8 wherein the flexible display has first and second opposing edges that join together at a joint.

10. The electronic device defined in claim 9 wherein the visual content extends across the joint.

11. An electronic device, comprising:
- a housing having a metal portion and first and second glass portions;
- a flexible display mounted in the housing, wherein the flexible display comprises a first set of pixels that emit light in a first direction through the first glass portion;
- a second set of pixels that emit light through the second glass portion;
- a camera facing the first direction and configured to capture face images; and
- control circuitry configured to track face movement using the face images and to adjust visual content on the second set of pixels based on the face movement.

12. The electronic device defined in claim 11 wherein the control circuitry is configured to process the face images using facial recognition software to track a user location.

13. The electronic device defined in claim 12 wherein the control circuitry adjusts a location of the visual content on the second set of pixels based on the user location.

14. The electronic device defined in claim 11 wherein the first glass portion is planar and is parallel to the second glass portion.

15. The electronic device defined in claim 11 wherein the flexible display comprises first and second opposing edges that join together at a joint and wherein the visual content extends across the joint.

16. An electronic device having front and rear surfaces, the electronic device comprising:
- an enclosure having a first transparent portion on the front surface and a second transparent portion on the rear surface;
- a first display region that emits light through the first transparent portion;
- a second display region that emits light through the second transparent portion;
- a camera on the front surface configured to detect a face using facial recognition software; and
- control circuitry configured to adjust visual content on the second display region based on the detected face.

17. The electronic device defined in claim 16 wherein the first and second transparent portions of the enclosure comprise glass.

18. The electronic device defined in claim 16 wherein the first and second display regions are formed on a flexible substrate that wraps from the front surface to the rear surface.

19. The electronic device defined in claim 16 further comprising an accelerometer, wherein the control circuitry is configured to adjust a location of the visual content based on information from the accelerometer.

20. The electronic device defined in claim 16 wherein the first transparent portion is planar.

* * * * *